(12) United States Patent
Xiong et al.

(10) Patent No.: US 12,510,305 B2
(45) Date of Patent: Dec. 30, 2025

(54) VAPOR CHAMBER REINFORCEMENT STRUCTURE

(71) Applicant: ASIA VITAL COMPONENTS (CHINA) CO., LTD., Shenzhen (CN)

(72) Inventors: Xi-Wen Xiong, Shenzhen (CN); Shu-Wang Xiao, Shenzhen (CN); Xing-Xing Lyu, Shenzhen (CN)

(73) Assignee: Asia Vital Components (China) Co., Ltd., Shenzhen (CN)

( * ) Notice: Subject to any disclaimer, the term of this patent is extended or adjusted under 35 U.S.C. 154(b) by 0 days.

(21) Appl. No.: 17/530,380

(22) Filed: Nov. 18, 2021

(65) Prior Publication Data
US 2023/0152044 A1    May 18, 2023

(51) Int. Cl.
*F28D 15/04* (2006.01)
*F28D 15/02* (2006.01)
*H05K 7/20* (2006.01)

(52) U.S. Cl.
CPC ....... *F28D 15/046* (2013.01); *F28D 15/0233* (2013.01); *H05K 7/20336* (2013.01)

(58) Field of Classification Search
CPC ............... F28D 15/046; F28D 15/0275; F28D 15/0233; F28D 15/04; F28F 2215/06; F28F 2240/00
See application file for complete search history.

(56) References Cited

U.S. PATENT DOCUMENTS

| | | | | |
|---|---|---|---|---|
| 3,701,448 A | * | 10/1972 | Vadnais | H02G 3/126 220/3.9 |
| 2008/0035310 A1 | | 2/2008 | Hsu | |

(Continued)

FOREIGN PATENT DOCUMENTS

| | | |
|---|---|---|
| CN | 201093903 Y | 7/2008 |
| CN | 109900148 A | 6/2019 |

(Continued)

OTHER PUBLICATIONS

Search Report dated Nov. 6, 2022 issued by Taiwan Intellectual Property Office for counterpart application No. 110142603.

(Continued)

*Primary Examiner* — Jianying C Atkisson
*Assistant Examiner* — Khaled Ahmed Ali Al Samiri
(74) *Attorney, Agent, or Firm* — Bradley J. Thorson; DeWitt LLP

(57) ABSTRACT

A vapor chamber reinforcement structure includes an upper cover and a lower plate. The upper cover is recessed to form at least one channel An opposite side of the channel is protruded to form at least one raised body. The lower plate is used to contact with a heat source and has a first capillary structure. The lower plate is correspondingly mated with the upper cover to form an airtight chamber for filling a working fluid. By means of the channel and the raised body disposed on the opposite side of the channel, the channel provides larger heat contact area for the heat conduction component (heat pipe) and more secure connection ability. Also, the raised body on the opposite side of the channel enhances the structural strength of the entire vapor chamber and enlarges the condensation contact area of the vapor chamber.

5 Claims, 4 Drawing Sheets

(56) References Cited

U.S. PATENT DOCUMENTS

| | | | | |
|---|---|---|---|---|
| 2009/0242168 A1* | 10/2009 | Cao | ............... | F28D 15/0266 |
| | | | | 29/890.03 |
| 2020/0045847 A1* | 2/2020 | Wakaoka | ........... | H05K 7/20336 |
| 2021/0095930 A1* | 4/2021 | Inagaki | ............... | F28D 15/0233 |

FOREIGN PATENT DOCUMENTS

| | | | | |
|---|---|---|---|---|
| CN | 111811305 A | 10/2020 | | |
| CN | 113465431 A | 10/2021 | | |
| CN | 216523312 U | 5/2022 | | |
| DE | 102014105680 B3 * | 5/2015 | ............. | F24S 10/95 |
| DE | 102014100420 A1 * | 7/2015 | ........ | H01M 10/6552 |
| TW | M464634 U | 11/2013 | | |
| TW | M598934 U | 7/2020 | | |
| TW | M624816 U | 3/2022 | | |

OTHER PUBLICATIONS

Search Report dated Nov. 19, 2024 issued by China National Intellectual Property Administration for counterpart application No. 202111356974X, 3 pages.

* cited by examiner

VAPOR CHAMBER REINFORCEMENT STRUCTURE

BACKGROUND OF THE INVENTION

1. Field of the Invention

The present invention relates generally to a vapor chamber reinforcement structure, and more particularly to a vapor chamber reinforcement structure, which enables the vapor chamber to directly connect with heat dissipation or heat conduction components and enhances the structural strength of the entire vapor chamber.

2. Description of the Related Art

Heat pipe and vapor chamber are both often seen heat transfer members employing two-phase fluid change to work. The heat pipe mainly provides remote end heat transfer in horizontal direction, while the vapor chamber provides heat transfer between faces in vertical direction.

In order to achieve both heat transfer in horizontal direction (heat pipes 6) and heat transfer in vertical direction (vapor chamber 7), some manufacturers try to combine the heat pipes 6 with the vapor chamber 7 so as to achieve heat transfer in both horizontal direction and vertical direction and enhance heat transfer performance.

However, the vapor chamber 7 is generally made of copper material for achieving better heat conductivity. As a result, the vapor chamber 7 is relatively soft and the structural strength of the vapor chamber 7 is poor. Therefore, in the conventional combination of the heat pipes 6 and the vapor chamber 7, it is impossible to directly assemble the heat pipes 6 with the vapor chamber 7. In case that the heat pipes 6 are directly connected with the vapor chamber 7, the vapor chamber 7 or the heat pipes 6 will be deformed or broken. Moreover, the connected parts of the vapor chamber 7 and the heat pipes 6 cannot be assembled by means of welding. This is because high heat will be generated in the welding process to destroy the two-phase fluid structures inside the heat pipes 6 and the vapor chamber 7. For example, the working liquid will be burnt dry or the capillary structures will detach from the heat pipes 6 and the vapor chamber 7. This will lead to damage of the vapor chamber 7 and the heat pipes 6. In order to solve the above problem, the manufacturers first securely connect the heat pipes 6 with a base seat 8 and then connect the base seat 8 with the vapor chamber 7 so that the vapor chamber 7 and the heat pipes 6 can be assembled and co-used.

However, the heat pipe 6 has many different configurations such as circular pipe, D-shaped pipe and flat-plate pipe. Please first refer to FIG. 1, which shows that a circular heat pipe 6 is secured on an upper surface (horizontal surface) of the base seat 8 by means of welding. The heat pipe 6 has a circular configuration so that when the heat pipe 6 is connected with the base seat 8, the heat pipe 6 simply contacts the base seat 8 along a line or at a point. As a result, the heat contact area between the heat pipe 6 and the base seat 8 is extremely small. This leads to poor heat conduction efficiency and poor connection strength between the heat pipe 6 and the base seat 8. Therefore, in order to enlarge the heat contact area between the heat pipe 6 and the base seat 8, a D-shaped pipe or a flat-plate pipe with at least one planar surface is selectively used and assembled with the base seat 8 instead of the circular pipe. This enlarges the heat contact area between the heat pipe 6 and the base seat 8. However, it is necessary to apply an external force to the heat pipe 6 for plastically shaping the heat pipe 6 into the D-shaped heat pipe or flat-plate heat pipe 6 with a planar surface and larger heat contact area so as to enlarge the heat contact area between the heat pipe 6 and the base seat 8.

This leads to another problem that in the shaping and processing process of the heat pipe 6, after the pipe wall of the heat pipe 6 is compressed and deformed, the capillary structure of sintered powder disposed on the inner wall face of the heat pipe 6 is apt to be damaged and the internal vapor passage of the heat pipe is narrowed. As a result, the inner capillary structure of the heat pipe 6 will be damaged to make the heat pipe 6 lose its two-phase fluid heat transfer function or deteriorate the two-phase fluid heat transfer function of the heat pipe 6.

Please now refer to FIG. 2. In order to improve the above shortcomings existing in the conventional vapor chamber, some manufacturers form an arc-shaped channel 81 on the base seat 8. The arc-shaped channel 81 has a configuration in adaptation to the configuration of the circular heat pipe 6, whereby the circular heat pipe 6 can be snugly disposed in the arc-shaped channel 81. This solves the problems that the heat contact area between the heat pipe 6 and the base seat 8 is insufficient and the heat pipe 6 is apt to be damaged when plastically shaped.

In practice, with respect to the conventional vapor chambers, the heat pipes 6 and the vapor chamber 7 cannot be directly connected with each other. It is necessary to additionally use the base seat 8 so as to connect the heat pipes 6 with the vapor chamber 7. In the case that the base seat 8 is additionally disposed between the heat pipes 6 and the vapor chamber 7, the base seat 8 will become an indirect heat conduction structure therebetween. As a result, the heat absorbed by the vapor chamber 7 cannot be directly conducted to the heat pipes 6. This will greatly reduce the heat conduction efficiency. Moreover, thermal resistance phenomenon will take place at the junctions between the base seat 8 and the heat pipes 6 and the junctions between the base seat 8 and the vapor chamber 7. Therefore, the additionally arranged base seat 8 not only reduces the heat conduction efficiency, but also increases the thickness and volume as well as the weight of the entire vapor chamber. Moreover, the added component leads to the problem of increase of the material cost and manufacturing cost.

It is therefore tried by the applicant to provide a vapor chamber reinforcement structure, which enables the heat pipes 6 and the vapor chamber 7 to directly correspondingly connect with each other without additionally using the base seat 8 and causing thermal resistance. Moreover, the vapor chamber reinforcement structure can enhance the structural strength of the entire vapor chamber 7 and enlarge the internal condensation area of the vapor chamber 7 as well as lower the manufacturing cost.

SUMMARY OF THE INVENTION

It is therefore a primary object of the present invention to provide a vapor chamber reinforcement structure, which enhances the structural strength of the vapor chamber and enables the vapor chamber to directly connect with the heat pipes without using any additional kit (component).

To achieve the above and other objects, the vapor chamber reinforcement structure of the present invention includes an upper cover and a lower plate.

The upper cover has a first side and a second side. The first side is recessed toward the second side to form at least one channel. An opposite side of the channel is protruded to form at least one rib. The lower plate has a first side and a second side in contact with a heat source. A first capillary structure is disposed on the first side of the lower plate. The lower plate is correspondingly mated with the upper cover to form an airtight chamber. A working fluid is filled in the airtight chamber.

According to the above arrangement, the channel is formed on one side of the upper cover of the vapor chamber reinforcement structure and the rib is formed on the other side of the upper cover corresponding to the channel. Therefore, the vapor chamber can be directly connected with an ordinary circular or arc-shaped heat pipe without using any additional assembling component or latch device. Also, the rib structure is formed on the opposite side of the channel corresponding to the channel or misaligned from the channel so that the channel provides a larger heat contact area for the heat conduction component (heat pipe) and the rib greatly enhances the structural strength of the entire vapor chamber and enlarges the internal condensation area of the vapor chamber. This not only avoids deformation or damage of the vapor chamber when assembled with the heat pipe, but also enhances the vapor-liquid circulation efficiency of the vapor chamber.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
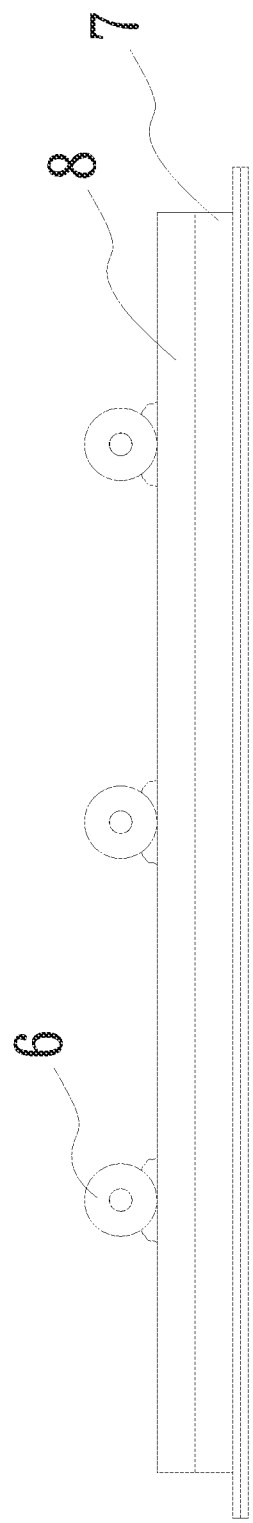
FIG. 1 is a schematic diagram of a conventional thermal module.
Figure 2:
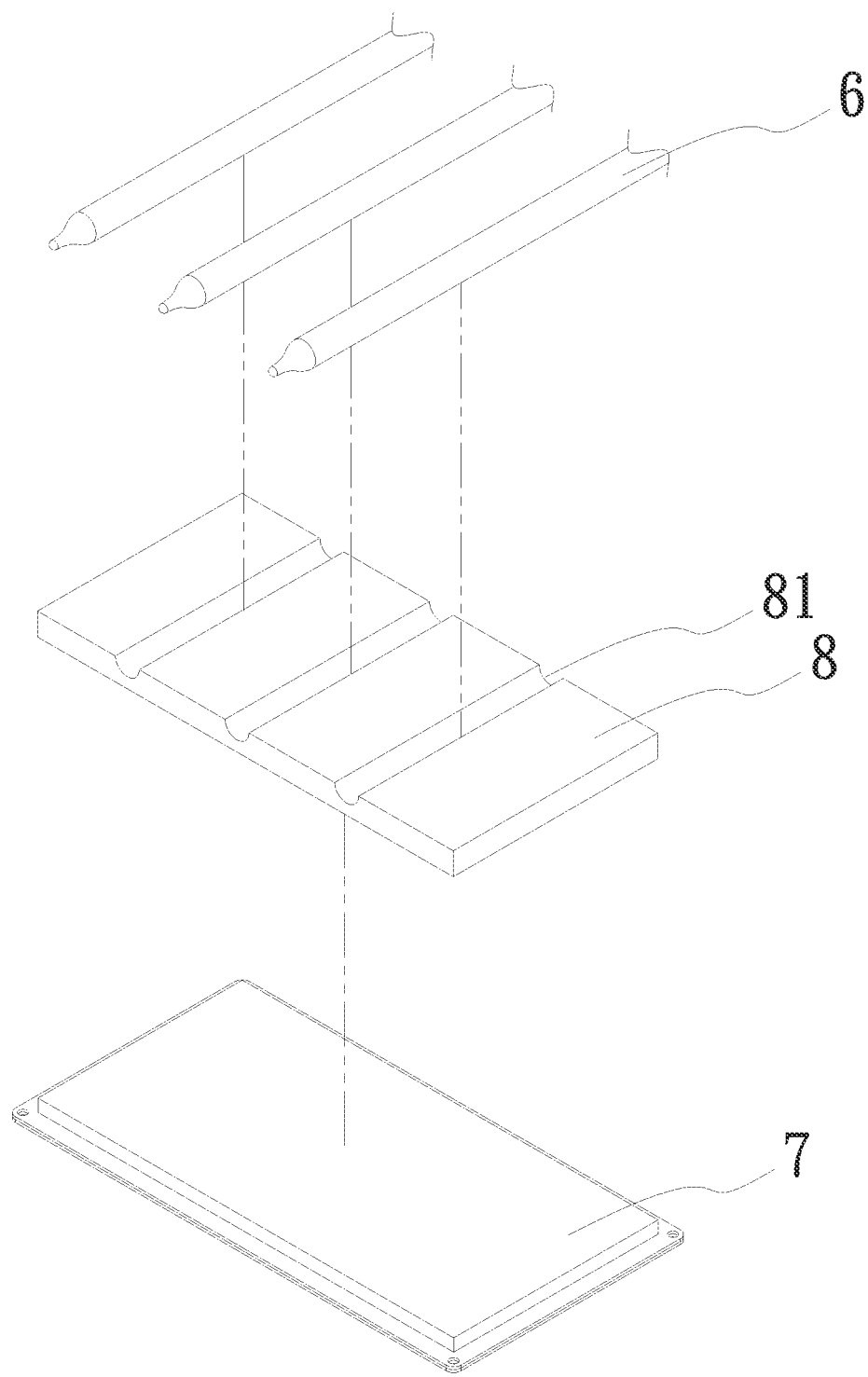
FIG. 2 is a schematic diagram of another conventional thermal module.
Figure 3:
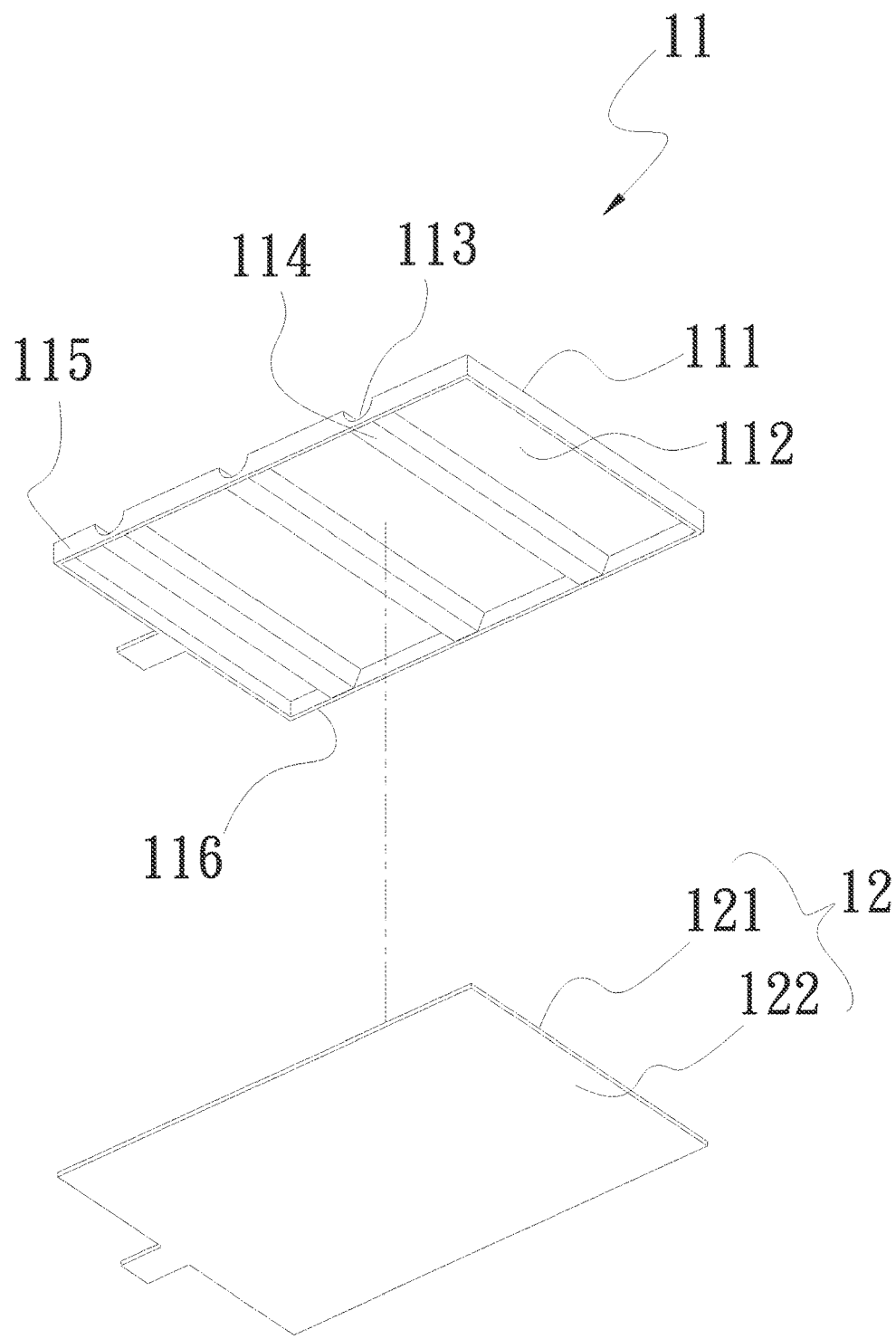
FIG. 3 is a perspective exploded view of a preferred embodiment of the vapor chamber reinforcement structure of the present invention.
Figure 4:
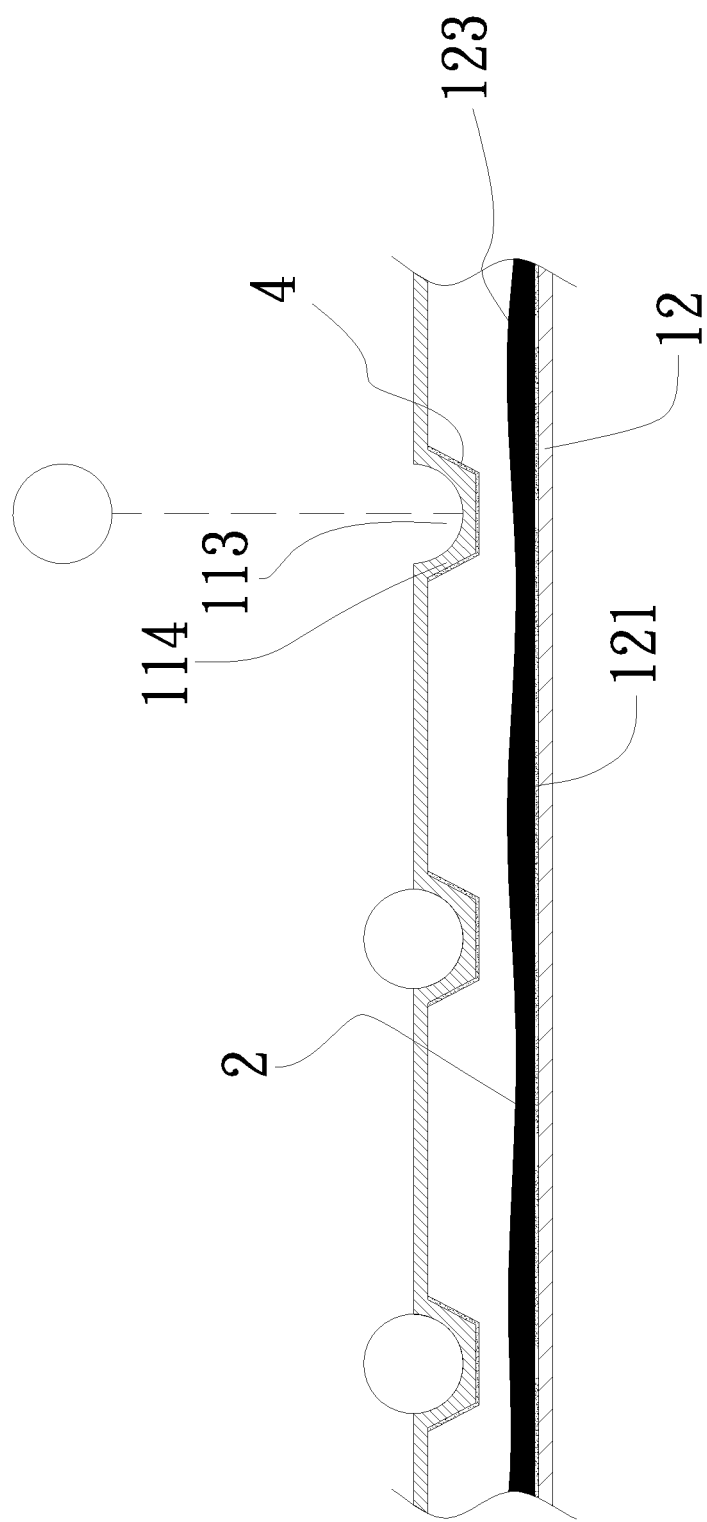
FIG. 4 is a sectional assembled view of the preferred embodiment of the vapor chamber reinforcement structure of the present invention.

Please refer to FIGS. 3 and 4. FIG. 3 is a perspective exploded view of a preferred embodiment of the vapor chamber reinforcement structure of the present invention. FIG. 4 is a sectional assembled view of the preferred embodiment of the vapor chamber reinforcement structure of the present invention. As shown in the drawings, the vapor chamber reinforcement structure of the present invention includes an upper cover 11 and a lower plate 12.

The upper cover 11 has a first side 111 and a second side 112 respectively positioned on upper and lower sides of the upper cover 11. The first side 111 and the second side 112 are also the outer side and inner side of the upper cover 11. The first side 111 is recessed toward the second side 112 to form at least one channel 113. The channel 113 is a structure produced (made) by means of applying an external force to the first side 111 so as to plastically deform the first side 111 or by means of other mechanical processing. The opposite side of the first side 111 is protruded to form at least one rib 114 corresponding to the channel 113. The rib 114 can be a protrusion structure formed when the first side 111 is plastically deformed under the external force or produced by means of other mechanical processing (such as casting, milling, cutting or planing). The rib 114 is selectively disposed corresponding to the channel 113 or misaligned from the channel 113. In this embodiment, the channel 113 is selectively formed by means of punching, pressing, hammering or swaging so that the opposite side is correspondingly formed with the rib 114. In this case, the rib 114 is disposed corresponding to the channel 113 as shown in FIG. 4. Alternatively, the channel 113 and the rib 114 can be misaligned from each other as shown in FIG. 5. The rib 114 serves to enhance the structural strength of the upper cover 11 as well as enlarge the condensation area of the second side 112.

Alternatively, the rib 114 can be formed by means of mechanical processing and misaligned from the channel 113. The rib 114 has the form of a rib, a protruding ring or a protruding cross. The rib 114 is a partially segmented rib or a continuous rib. In this embodiment, the rib 114 is, but not limited to, a rib for illustration purposes.

The upper cover 11 has a first lateral side 115 and a second lateral side 116. One end of the channel 113 is connected with the first lateral side 115, while the other end of the channel 113 is connected with the second lateral side 116. That is, the channel 113 extends through the upper cover 11 from the first lateral side 115 to the second lateral side 116.

The channel 113 can extend in a transverse direction of the upper cover 11 (as shown in FIGS. 3 and 4) or extend in a longitudinal direction of the upper cover 11. Alternatively, the channels 113 can extend in both the transverse direction and the longitudinal direction of the upper cover 11 to intersect and connect with each other. The longitudinal direction of the upper cover 11 is in parallel to the first lateral side 115, while the transverse direction of the upper cover 11 is normal to the first lateral side 115.

The lower plate 12 has a first side 121 and a second side 122. The lower plate 12 is correspondingly mated with the upper cover 11 to form an airtight chamber 13. A working fluid 2 is filled in the airtight chamber 13. A first capillary structure 3 is disposed on the first side 121 of the lower plate 12.

The channel 113 formed on the first side 111 of the upper cover 11 mainly serves as a section for receiving other heat dissipation or heat conduction member such as a heat pipe 5. The channel 113 has a configuration in adaptation to the configuration of the heat conduction member correspondingly disposed in the channel 113, whereby the heat conduction member can be easily assembled in the channel 113 without using any other fixing member or base seat. This not only saves the manufacturing cost, but also prevents the heat conduction member from failing to tightly attach to the vapor chamber and avoids any gap between the heat conduction member and the vapor chamber, which will cause thermal resistance. In this embodiment, the heat conduction member is, but not limited to, a heat pipe 5 for illustration purposes. The channel 113 formed on the upper cover 11 has a configuration in adaptation to the configuration of the heat pipe 5 to be disposed in the channel 113. The circular heat pipe 5 is directly disposed in the channel 113 and assembled with the upper cover 11 without using any additional base seat to first fix the heat pipe 5. Also, the heat pipe 5 can be connected with the upper cover 11 without welding process. Therefore, the cost for the material is saved and the thermal resistance caused by the gaps between numerous connected components is avoided. In addition, the heat pipe 5 is in contact with the channel 113 by maximal area so that the heat conduction efficiency between the heat pipe 5 and the upper cover 11 is enhanced. Moreover, the heat pipe 5 keeps having a vapor passage with maximal capacity so that the two-phase fluid circulation of the heat pipe 5 is better than the heat pipe 5 with other configuration.

By means of the vapor chamber reinforcement structure of the present invention, the vapor chamber can be directly connected with an ordinary circular or arc-shaped heat pipe without using any additional assembling component or latch device. Also, the rib structure 114 is formed on the opposite side of the channel 113 corresponding to the channel 113 or misaligned from the channel 113 so that the structural strength of the entire vapor chamber is enhanced and the condensation contact area is enlarged. This not only avoids deformation or damage of the vapor chamber when assembled with the heat pipe, but also enhances the transformation efficiency of the two-phase fluid in the vapor chamber so as to promote the heat conduction effect.

A second capillary structure 4 is further disposed on the rib 114 of the upper cover 11. The second capillary structure 4 is plainly laid on the surface of the rib 114 of the upper cover 11.

In addition, multiple support columns (not shown) extend from the first side 121 of the lower plate 12 to abut against the second side 112 of the upper cover 11 or the raised bodies 114. The first capillary structure 3 partially extends to the surfaces of the support columns, whereby the first capillary structure 3 partially connects with the second capillary structure 4.

The primary object of the present invention is to provide a vapor chamber structure, which has enhanced structural strength and can be directly connected and assembled with heat pipes or other heat dissipation or heat conduction components. An external force is applied to one side of the vapor chamber to plastically deform the upper cover and form the channel. The heat dissipation or heat conduction component is directly received in the channel and correspondingly assembled with the upper cover. The rib is formed on the opposite side of the channel corresponding to the channel or misaligned from the channel so that the structural strength of the vapor chamber is enhanced and the condensation contact area is also enlarged. The rib not only enhances the structural strength of the vapor chamber, but also enlarges the condensation area to enhance the vapor-liquid circulation efficiency. The present invention improves the shortcoming of the conventional vapor chamber that the vapor chamber cannot be directly assembled with those heat dissipation or heat conduction components with no planar surfaces. Also, the present invention enhances the structural strength of the vapor chamber and promotes the vapor-liquid circulation efficiency of the vapor chamber.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A vapor chamber reinforcement structure comprising: an upper cover having a first side, a second side, a first lateral side and a second lateral side, a portion of the first side being recessed toward the second side to define at least one semi-cylindrical channel configured to fit and receive a heat pipe, the at least one semi-cylindrical channel extending continuously from the first lateral side to the second lateral side, the channel being protruded from a portion of the second side to form at least one rib, the rib having a first side defining the at least one semi-cylindrical channel and an opposing second side presenting an outer surface with a plurality of angled flat faces for structural reinforcement of the upper cover; and a lower plate having a first side and a second side, the second side of the lower plate in contact with a heat source, the lower plate being mated with the upper cover to form an airtight chamber with the outer surface of the at least one rib inside the airtight chamber, a first capillary structure being disposed on the first side of the lower plate and not contacting the at least one rib, a working fluid being filled in the airtight chamber.

2. The vapor chamber reinforcement structure as claimed in claim 1, further comprising a second capillary structure disposed on the outer surface of the at least one rib of the upper cover.

3. The vapor chamber reinforcement structure as claimed in claim 1, wherein the flat faces of the outer surface of the at least one rib form three sides of a trapezoid when viewed in a cross-section through the at least one rib.

4. The vapor chamber reinforcement structure as claimed in claim 1, wherein the plurality of flat faces of the outer surface includes three contiguous flat faces angled with respect to each other.

5. The vapor chamber reinforcement structure as claimed in claim 4, wherein the flat faces comprise a three-sided geometrical shape presenting a first surface extending between opposing second and third surfaces, the first surface in a first plane parallel to a second plane defined by an unrecessed portion of the first side, such that the three-sided geometrical shape has a trapezoidal configuration.

* * * * *